(12) United States Patent
Gaul et al.

(10) Patent No.: US 8,232,137 B2
(45) Date of Patent: Jul. 31, 2012

(54) HEAT CONDUCTION FOR CHIP STACKS AND 3-D CIRCUITS

(75) Inventors: Stephen Joseph Gaul, Melbourne Village, FL (US); Francois Hebert, San Mateo, CA (US)

(73) Assignee: Intersil Americas Inc., Milpitas, CA (US)

( * ) Notice: Subject to any disclaimer, the term of this patent is extended or adjusted under 35 U.S.C. 154(b) by 162 days.

(21) Appl. No.: 12/773,275

(22) Filed: May 4, 2010

(65) Prior Publication Data

US 2011/0140126 A1 Jun. 16, 2011

Related U.S. Application Data

(60) Provisional application No. 61/285,325, filed on Dec. 10, 2009, provisional application No. 61/295,292, filed on Jan. 15, 2010.

(51) Int. Cl.
*H01L 21/00* (2006.01)

(52) U.S. Cl. ........ 438/105; 438/106; 438/680; 438/692; 257/E21.058; 257/E21.077; 257/E21.166; 257/E21.17; 257/E21.229; 257/E21.324; 257/E21.546; 257/E21.603

(58) Field of Classification Search .................. 438/105, 438/106, 122, 123, 613, 637, 700, 680, 692; 257/E21.058, E21.077, E21.17, E21.166, 257/E21.229, E21.324, E21.546, E21.603
See application file for complete search history.

(56) References Cited

U.S. PATENT DOCUMENTS

| | | | |
|---|---|---|---|
| 5,561,303 A | 10/1996 | Schrantz et al. | |
| 5,608,264 A | 3/1997 | Gaul | |
| 5,618,752 A | 4/1997 | Gaul | |
| 5,646,067 A | 7/1997 | Gaul | |
| 5,682,062 A | 10/1997 | Gaul | |
| 5,814,889 A | 9/1998 | Gaul | |
| 5,913,148 A * | 6/1999 | Hills | 438/701 |
| 7,288,481 B2 * | 10/2007 | Nemoto | 438/667 |
| 7,973,413 B2 * | 7/2011 | Kuo et al. | 257/774 |

OTHER PUBLICATIONS

Emma, P.G. and E. Kursun, Is 3-D chip technology the next growth engine for performance improvement?, IBM J. Res. & Dev., vol. 52, No. 6, Nov. 2008, pp. 541-581.

* cited by examiner

*Primary Examiner* — David Nhu
(74) *Attorney, Agent, or Firm* — Fogg & Powers LLC

(57) ABSTRACT

A semiconductor device assembly and method can include a single semiconductor layer or stacked semiconductor layers, for example semiconductor wafers or wafer sections (semiconductor dice). On each semiconductor layer, a diamond layer formed therethrough can aid in the routing and dissipation of heat. The diamond layer can include a first portion on the back of the semiconductor layer, and one or more second portions which extend vertically into the semiconductor layer, for example completely through the semiconductor layer. Thermal contact can then be made to the diamond layer to conduct heat away from the one or more semiconductor layers. A conductive via can be formed through the diamond layers to provide signal routing and heat dissipation capabilities.

11 Claims, 8 Drawing Sheets

HEAT CONDUCTION FOR CHIP STACKS AND 3-D CIRCUITS

CROSS REFERENCE TO RELATED APPLICATION

This application claims to the benefit of U.S. Provisional Application Ser. No. 61/285,325 filed Dec. 10, 2009, and to U.S. Provisional Application Ser. No. 61/295,292 filed Jan. 15, 2010, both incorporated herein by reference.

DESCRIPTION OF THE EMBODIMENTS

Reference below is made in detail to the present embodiments (exemplary embodiments) of the present teachings, examples of which are illustrated in the accompanying drawings. Wherever possible, the same reference numbers will be used throughout the drawings to refer to the same or like parts. The drawings, which are incorporated in and constitute a part of this specification, illustrate embodiments of the invention and together with the description, serve to explain the principles of the invention. In the figures.

It should be noted that some details of the FIGS. have been simplified and are drawn to facilitate understanding of the inventive embodiments rather than to maintain strict structural accuracy, detail, and scale.

A diamond layer is an efficient heat conductor. In an embodiment of the present disclosure, a diamond layer can be formed to provide a heat conduction path to channel heat away from the interior of a stacked module and/or vertically through the stacked module.

The diamond material may be undoped, for example to provide a thermally conductive but electrically insulative layer. In other uses, the diamond layer can include a dopant concentration to provide an electrically conductive connector, for example P+ concentration of boron which is sufficient to result in an electrically conductive and thermally conductive diamond layer which can be used effectively to decrease substrate noise and substrate resistance, which can minimize device latch-up. Dopants can be introduced into the diamond material using implantation or in situ doping while the diamond is being deposited or grown on the substrate.

Figure 1:
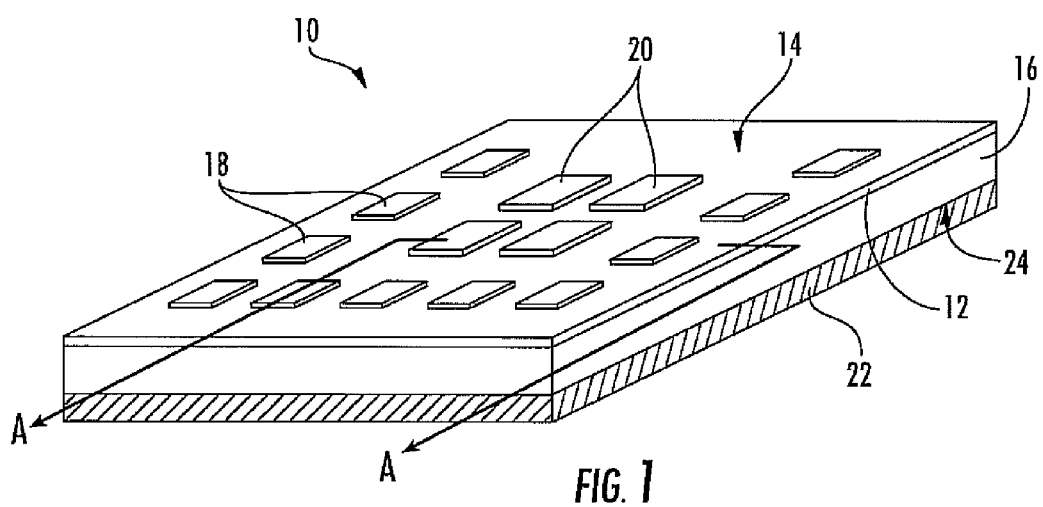
FIG. 1 is a perspective view of a semiconductor device in accordance with an embodiment of the present teachings.

FIG. 1 is a perspective view of an embodiment of the present teachings. FIG. 1 depicts a semiconductor assembly 10 which can include interconnect layers (circuitry) 12 formed on a front (circuit) side or surface 14 of a semiconductor layer 16. The semiconductor assembly can be a functional semiconductor device, a portion of a functional semiconductor device, or a semiconductor device which is in the process of being manufactured. The semiconductor layer can include, for example, a semiconductor wafer, a single semiconductor die, an epitaxial semiconductor layer, a semiconductor substrate assembly including a semiconductor wafer and an epitaxial layer, a plurality of unsingularized semiconductor dice such as a section of a semiconductor wafer.

FIG. 1 further depicts integrated circuit (IC) pads 18 such as bond pads or interconnect pads formed on the front of the semiconductor layer 16. The device of FIG. 1 further depicts heat conduction pads 20 formed on the circuit side 14 of the semiconductor layer 16, and a diamond layer 22 formed on a back (noncircuit) side or surface 24 of the semiconductor layer 16. The diamond layer 22 can extend at least partially through the semiconductor layer 16, or completely through the semiconductor layer as depicted in FIG. 2.

The semiconductor layer can include one or more active devices such as metal oxide semiconductor (MOS) devices, bipolar junction transistors (BJTs), resistors such as diffused resistors, etc. Other structures such as seal rings, contacts, vias, metals, interlayer dielectrics, polysilicon, etc. can also be formed on and/or within the semiconductor layer.

Figure 2:
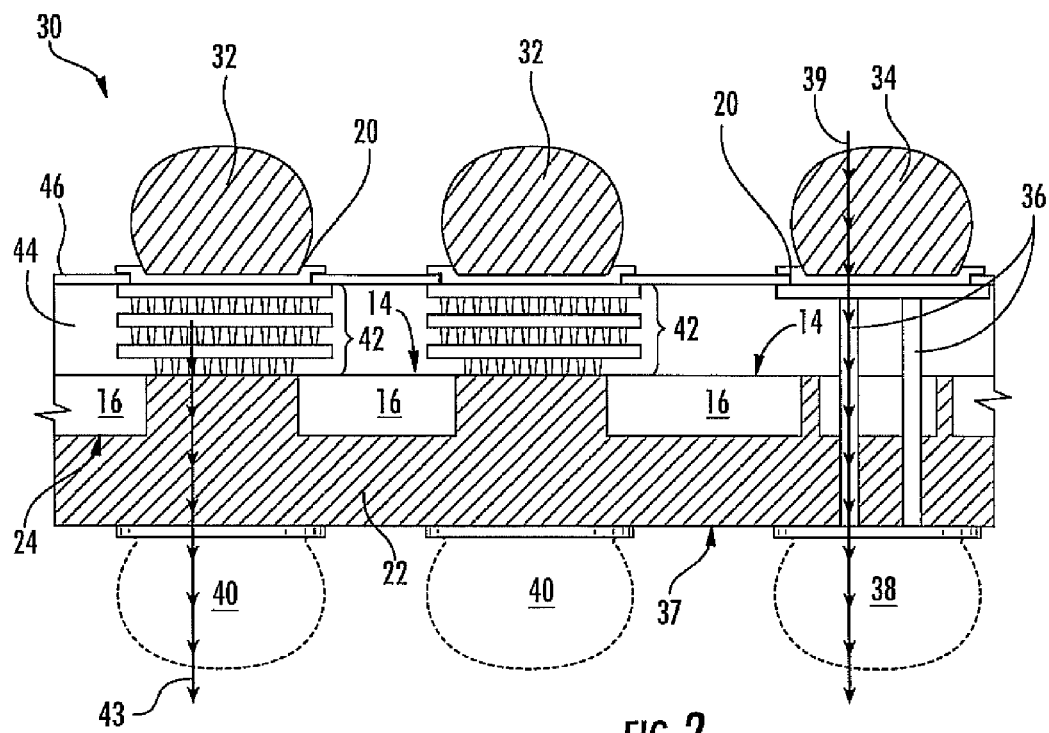
FIGS. 2-6 are cross sections depicting various device structures according to embodiments of the present teachings.

The FIG. 2 cross section depicts a device 30 in accordance with the FIG. 1 device along A-A, subsequent to the formation of controlled collapse chip connections ("CCCC" or "C4" connections) 32, 34. Heat conduction and transfer can be provided in part by the diamond layer 22. In addition, through-substrate vias (TSVs) 36 can be used to pass heat vertically through the device 30. C4 connections 38 formed on the back surface 37 of the diamond layer 22 can be connected with the TSVs 36 to pass heat to an adjacent substrate. Thus, in one use, a heat transfer path 39 is provided from a surface connected to the C4 connection 34, to pad 20, to TSVs 36, to C4 connection 38, then to a receiving substrate such as a printed circuit board (PCB), another device similar to device 30, or another receiving substrate. Heat transfer can occur in either direction between connections 34 and 38, or away from diamond layer 22 and toward both connections 34 and 38.

The diamond layer 22 can be formed to extend from the back surface 24 of the semiconductor layer 16 and through the semiconductor layer 16. TSVs 36 can contact the diamond layer 22 and the pad 20 that has a planar surface which is coplanar with a front (circuit) side or surface of the semiconductor layer. Other metallization structures, for example as depicted, can be formed.

Other C4 connections 40 can be connected to only the diamond layer 22, and can be used to transfer heat away from the diamond layer 22 to a receiving substrate to which C4 connections 40 are attached (not depicted). In another embodiment, C4 connections 38, 40 can receive heat from another device, and pass the heat laterally through diamond layer 22 for dissipation.

The diamond layer 22 can also provide heat conduction away from active circuitry connected to the heat conduction pads 20 and C4 connections 32. As depicted in FIG. 2, three metallization layers 42 are used to both transfer an electrical input/output (I/O) signal laterally through circuitry to other devices or device circuitry, and to transfer heat which is generated during device operation vertically along a path 43 to the diamond layer 22 for conduction away from the circuit. The metallization layers 42 formed over the front surface of the semiconductor layer 16 can include one or more conductors. Additionally, one or more dielectric layers 44 and passivation layers 46 can be formed for electrical isolation.

The FIG. 2 device 30 can be formed using a commercially-available diamond-backed wafer, such as a silicon wafer, or the diamond layer on the back can be grown, attached, or otherwise positioned on the back of the wafer. An etch that is selective to diamond (i.e. which etches the diamond at a lower rate than it etches silicon) can be used to etch through the front silicon surface to expose the diamond from the front of the wafer through a trench, a via, or another opening (referred to herein collectively as a "trench" or "opening"). Thus the silicon is etched from the circuit side and the diamond is exposed from the front surface of the silicon. Next, a diamond growth process can be performed to grow the diamond on the exposed planar diamond layer and through the opening in the silicon, for example using a diamond refill process. The backside diamond layer, which provides a diamond crystal structure, can function as a diamond crystallization nucleus during the diamond growth through the opening. A diamond deposition method can include, for example, hot filament decomposition of methane at a temperature of about 700° C.

Once the diamond has been grown to extend through the opening in the silicon layer, the diamond can be planarized, for example using a chemical mechanical polishing (CMP) process or an etch to planarize the upper surface. The diamond layer which is grown to extend through the opening in the silicon can be planarized such that it is generally coplanar with the semiconductor layer front surface. Thus the structure of FIG. 2 includes a diamond layer 22 having a planar lower portion and vertically oriented diamond layer portions which extend from the lower planar layer and through the semiconductor layer 16, which can be coplanar with the front surface 14 of the semiconductor layer 16.

In use of the semiconductor device 30, the topography of the FIG. 2 device 30 can be employed using the diamond-filled trench areas and the contact to the heat conduction pads 20 to transmit heat vertically away from the semiconductor layer 16 to the diamond layer 22. The C4 connections 32 (a ball grid array "BGA," for example) depicted on the left side of FIG. 2 can therefore be used for the conduction of heat away from a surface to which the C4 connections are attached, through metallization layers 42, and to diamond layer 22. The heat can then be conducted through C4 connection to a receiving substrate. Heat can also be conducted laterally through diamond layer 22.

Figure 3:
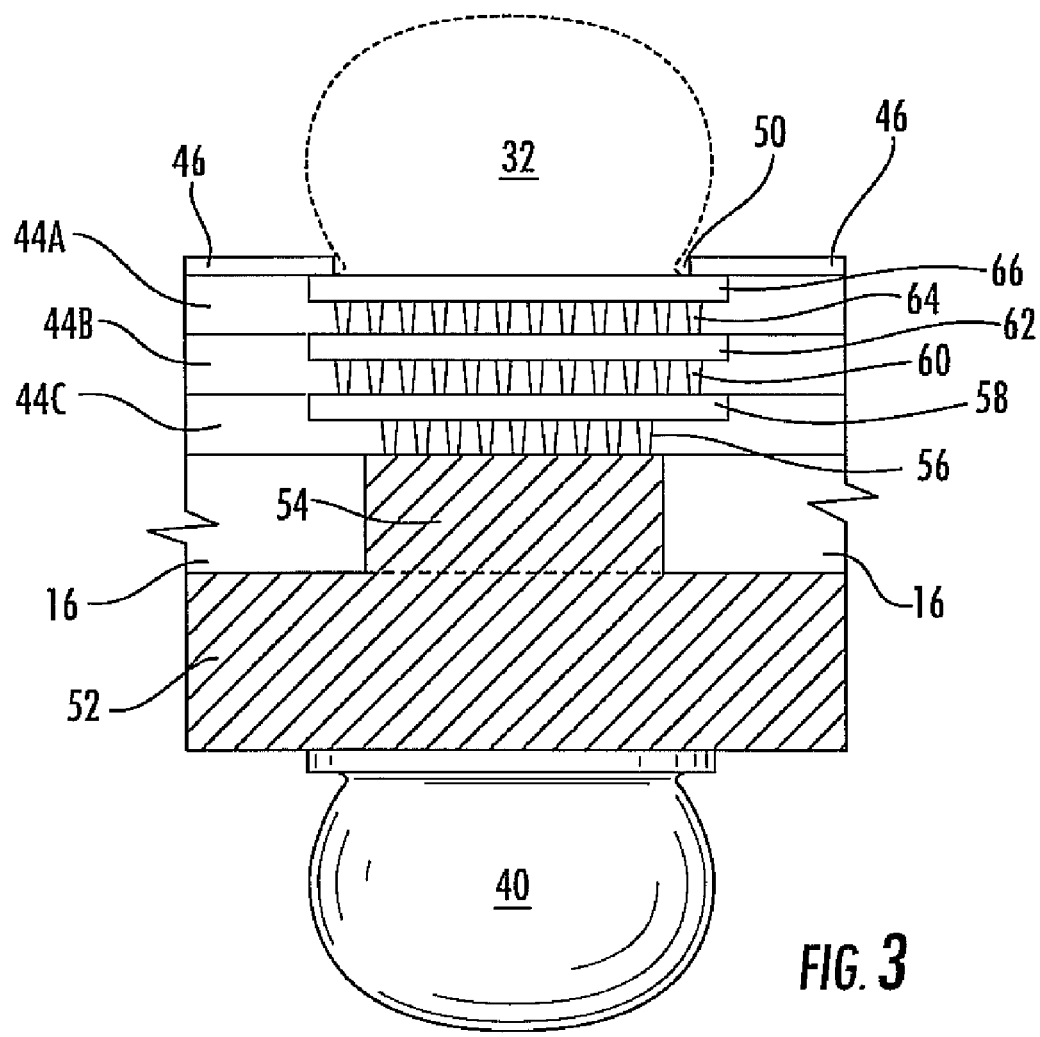

FIG. 3 depicts a magnified view of a portion of a heat conduction pad of FIG. 2 (the two left-side structures of FIG. 2 including C4 connections 32). The diamond substrate layer 52 and diamond trench refill 54 can be used to conduct heat rapidly away from the semiconductor layer 16 during subsequent use of the device. Heat conduction to the top of the diamond trench refill 54 can be provided by the metal system (metallization) used in the metallization layers (42 in FIG. 2). In this specific case, three levels of metal are used to form structures 56-66, which can be formed using a metal damascene process and three dielectric layers 44A-44C. A pad opening 50 through passivation 46 can expose the top metal 66 to complete the heat conduction pad as depicted.

The FIG. 3 structure can include a Metal 1 layer to form contacts 56 to the diamond refill 54 and metal interconnect layer 58, a Metal 2 layer to form vias 60 to metal layer 58 and metal interconnect layer 62, and a Metal 3 layer to form vias 64 and metal interconnect layer 66. In this use, the contacts 56 are not used to pass an electrical signal to diamond trench refill 54, while vias 60, 64 pass an electrical signal between layers 58 and 62, and layer 62 and 66 respectively. Thus these three metal layers include a contact layer 56 to the diamond refill 54 and two via levels 60, 64. The C4 interconnect 32 can be used to provide heat conduction from the top of the pad 66 to another chip assembly, which can be similar to the assembly of FIGS. 2 and 3. The back side C4 connection 40 can be used to thermally couple back side diamond layer 52 to a receiving substrate (not shown). Thus heat can be passed from silicon layer 16, to diamond layer 52, to C4 connection 40, to a receiving substrate. In another use, heat can be passed from a pad of another device, to C4 connection 40, to diamond layer 52, and laterally through diamond layer 52 to a heat sink for dissipation. In an embodiment, conductor 40 is adapted to conduct heat to or away from the diamond layer during device operation, but is not adapted to conduct an electrical signal during device operation.

Figure 4:
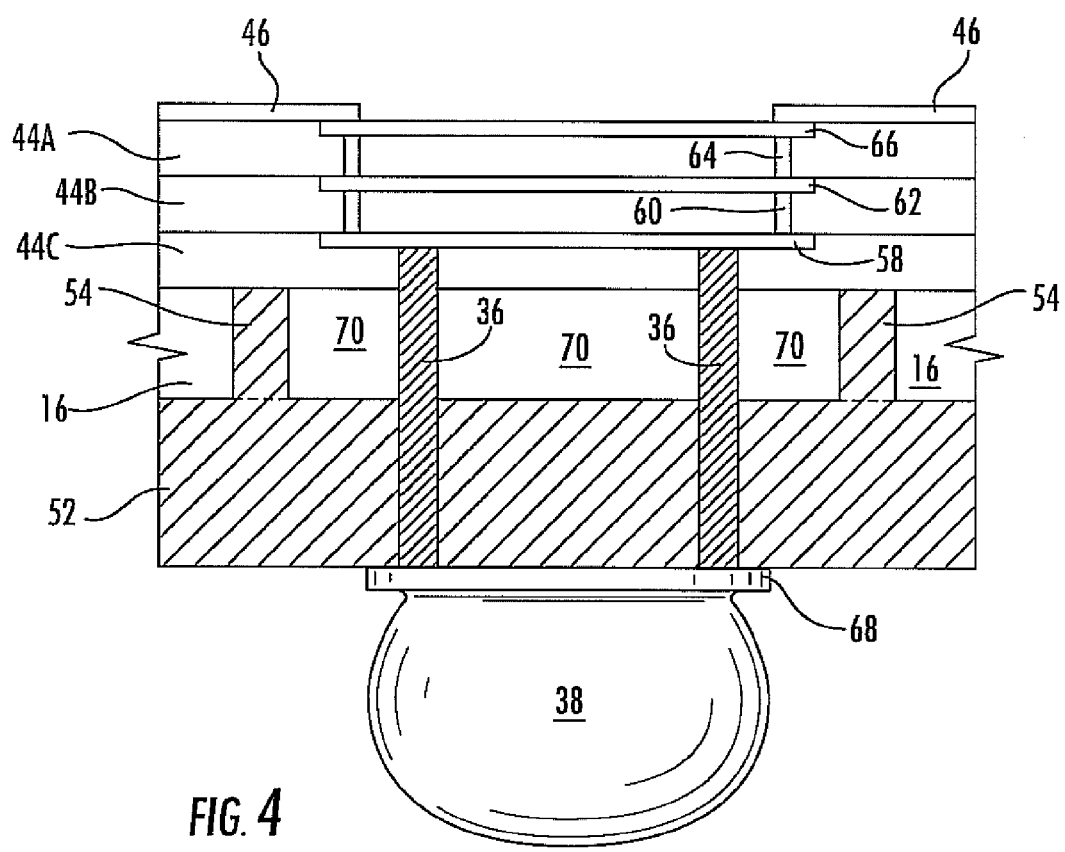

FIG. 4 depicts a magnified view of a portion of a heat conduction pad of FIG. 2 (the right-side structure of FIG. 2).

In this embodiment, C4 structure 34 of FIG. 2 will not be formed on this device, but will be provided by another device similar to that of the FIG. 4 device. C4 connection 38 will be formed to receive heat from metal 58-66, and from another device connected to metal 66, through TSVs 36. After forming bond pad 20 of FIG. 2, a C4 structure similar to 38 on another device can be attached to the metal 66 so that heat can be transferred through vias 36 to pad 68 and to C4 connection 38. This can provide a stacked device design with improved thermal handling over previous stacked devices.

Thus FIG. 4 depicts TSVs 36 processed from the back side of the silicon-diamond IC substrate 16, 52, 54 which can be used to route heat from or to another device. A TSV formation process can include a trench etch through the back side diamond layer 52, through silicon 16, and through dielectric layer 44C to expose Metal 1 58 from the back side of the silicon-diamond composite wafer through one or more via openings. A subsequent conductive layer deposition, for example using a metal refill of tungsten, can fill the one or more vias to provide electrical contact to Metal 1 structure 58. A patterned conductive backside pad 68, followed by a solder ball process such as a C4 process to form C4 connection 38, can be used to complete the TSV contact to Metal 1. Other TSV formation processes could be used, including processes that create the TSV from the front side of the wafer. In an embodiment, the TSV refill material is limited only to materials that do not chemically interact with diamond. In another embodiment, TSV liners can be formed on diamond sidewalls, for example from nitride and silicon dioxide. The liners can electrically insulate the conductor from the diamond and/or to the substrate. Undoped diamond can be formed as an insulation layer, however, and is compatible with a wide range of TSV refill materials and metals. In other embodiments, the conductor can physically contact a conductively doped diamond layer to provide substrate contacts with improved thermal conduction.

A process resulting in a structure similar to FIG. 4 can include the formation of insulating diamond "fingers" 54 that extend through the silicon layer 16 to encircle the central silicon portion 70 of silicon layer 16 through which the TSVs 36 are formed. While the FIG. 4 cross section depicts two vertical fingers 54, one on either side of the central semiconductor region 70, the vertical diamond structures can form one continuous region completely around the perimeter of the central silicon region 70 through which TSVs 36 extend. Because the diamond in this embodiment is an insulator, the central silicon portion 70 is electrically isolated from other conductive or semiconductive structures formed in the silicon layer 16. Thus no additional isolation is needed to electrically isolate the metal TSVs 36 from the silicon layer 16, because isolation of the TSV metal refill from the semiconductor layer is provided through the use of the diamond-filled trench isolation 54 surrounding the TSVs 36.

Figure 5:
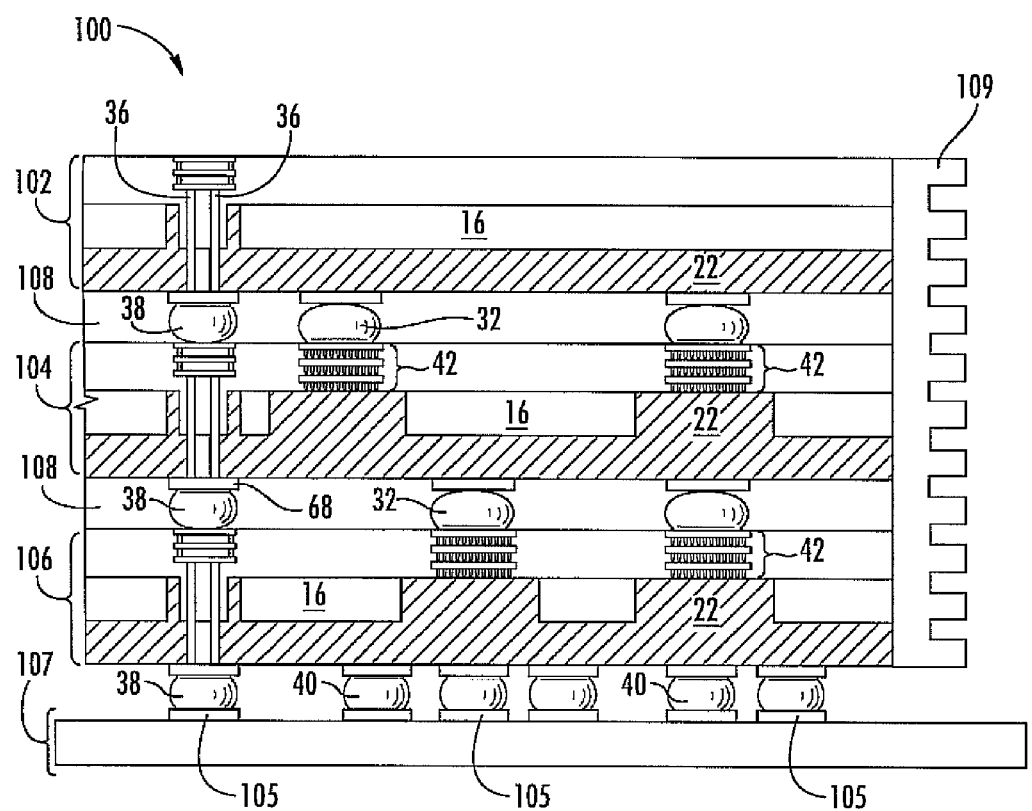

FIG. 5 depicts a plurality of stacked semiconductor assemblies, such as semiconductor wafers, semiconductor wafer substrate assemblies, or semiconductor wafer sections, for example semiconductor dice. Stacked chips or 3D IC's can be wired electrically and thermally using diamond-based substrates, diamond trench refills, and heat conduction pads. FIG. 5 illustrates one embodiment of the present teachings for stacking three IC's. A bond pad with one or more TSVs can be used for I/O routing, while the heat conduction pads can be used for thermal routing.

The FIG. 5 stacked semiconductor assembly 100 can include first 102, second 104, and third 106 stacked semiconductor dice. The stacked assembly can include various structures of previous embodiments formed using similar methods. FIG. 5 further depicts dielectric 108 that can be used to mechanically attach each of the semiconductor dice 102-106 together.

C4 connections 40 can provide thermally conductive connections to conduct heat away from the stacked assembly 100. C4 connections 40 can be attached to pads 105 on a receiving substrate 107, for example using solder reflow of C4 connections 38, 40. In an embodiment, C4 connections 38, 40 are adapted to provide heat conduction away from diamond layer 22. A thermally conductive path from chip 102 to chip 104 can be supplied by C4 connections 32 and 38 that are interposed between chip 102 and chip 104, as well as TSVs 36. A thermally conductive path from chip 104 to chip 106 can be supplied by C4 connections 32 and 38 that are interposed between chip 104 and chip 106, as well as TSVs 36. Metallization layers 42 can provide both electrical routing of signals and thermal routing of heat between the chips. Other thermal connections can be made laterally at the edges of diamond layer 22, for example to connect with a heat spreader 109, for example a heat sink, such that the heat is dissipated horizontally through diamond layer 22 as well as dissipation through C4 connections 38, 40.

Thus the stacked IC assembly can be formed as a package or module 100. The C4 connections 38, 40 can be attached to pads 105 on a receiving substrate 107. Heat generated by the IC's can be efficiently conducted away from the one or more semiconductor layers to the receiving substrate 107 and/or to a heat spreader 109 where it can be dissipated, thereby reducing adverse effects from excessive thermal levels.

Figure 6:
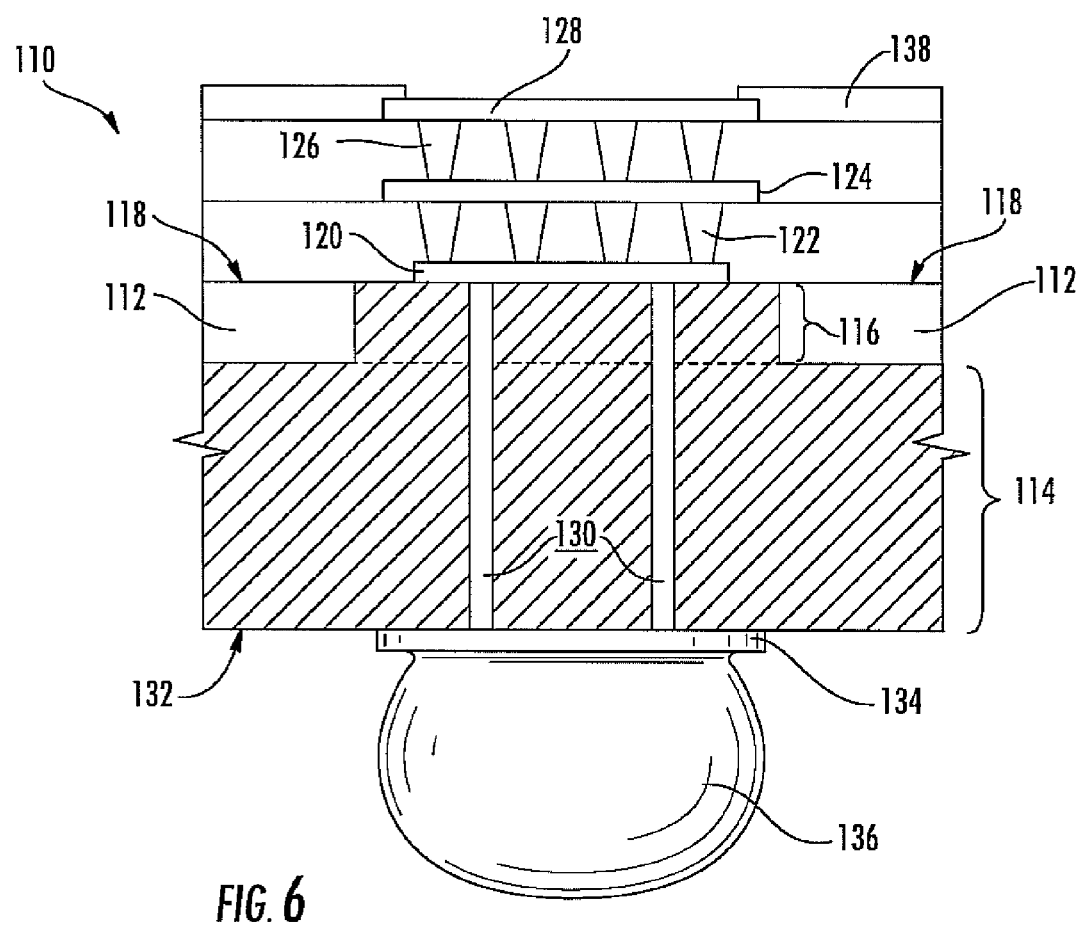

FIG. 6 depicts a device 110 which can be formed and provided in accordance with another embodiment of the present teachings. This embodiment can include a semiconductor layer 112 such as a semiconductor wafer or wafer section. A diamond layer 114 can be formed on the back of the semiconductor layer 112, or a preformed diamond layer can be attached to a semiconductor wafer. A diamond trench refill process can be used to form a diamond trench refill 116 through an opening in the semiconductor layer 112. To form the diamond trench refill 116, an opening can be etched into the semiconductor layer 112 from a front (circuit) side 118 of the semiconductor layer 112 to expose the back side diamond layer 114 from the semiconductor layer side, then the diamond layer 114 can be used as a crystallization nucleus to grow diamond trench refill 116 through the opening. A planarization step, for example using CMP, can be used to planarize any diamond trench refill portion extending through the opening beyond the front surface 118 of semiconductor layer 112.

FIG. 6 further depicts a Metal 1 layer that forms pad 120, a Metal 2 layer which can form both vias 122 and pad 124, and a Metal 3 layer that can form vias 126 and pad 128.

Next, through-diamond vias (TDVs) 130 can be formed by anisotropically etching through both the diamond layer 114 and the diamond trench refill 116 from the exposed side of 132 of the diamond layer 114 to form one or more TDV openings. The etch continues through the diamond layer 114 and the diamond trench refill 116 to expose the back side of the Metal 1 pad 120. A metal layer using, for example, a tungsten refill process or a chemical vapor deposition (CVD) process, can be formed to fill the TDV openings with conductor.

Next, a pad metallization process can be used to form a pad 134 such as a bond pad, and a solder ball 136 such as a C4 ball, ball grid array (BGA) structure, or other conductor can be formed on pad 134. A protective passivation layer 138 can be formed to complete the structure of FIG. 6.

The structure of FIG. 6 can be used to provide I/O routing through both the diamond layer 114 and the diamond refill 116. In this embodiment, the TDV structures 130 do not pass through the semiconductor substrate 112. Since the two diamond structures 114, 116 can be electrical insulators, the openings do not need to be lined with a dielectric to electrically isolate the TDVs from the semiconductor substrate, and other isolation techniques are not necessary. The conductive vias 130 are electrically isolated from the semiconductor layer by the diamond layer. As depicted in FIG. 6, a portion of both the diamond layer 116 and the conductive vias 130 are directly interposed between portions of semiconductor layer 112.

The FIG. 6 structure combines both heat conduction and signal conduction (I/O routing) through the diamond layers 114, 116, providing a valuable savings in die area. The structure can have various advantages. For example, the structure can be used with many or all metal systems. Further, it can provide a die-to-die attachment using a C4 process, an interposer, and copper-to-copper (Cu—Cu) wafer and/or die bonding, etc. Additionally, the structure can include the use of through-silicon and/or though-substrate via technology, along with one or more diamond filled trenches. Various electrical isolation processes and structures which may be required with conventional through silicon vias are not necessary in an embodiment of the invention, for example because the TDVs do not pass through silicon.

Some semiconductor assemblies can include one or more semiconductor die which includes a diamond layer for thermal conduction and/or electrical insulation, and one or more semiconductor die which does not include a diamond layer. Other embodiments can include a semiconductor layer with at least two openings, one filled with a conductor and the other filled with a diamond layer. The diamond layer can be either an electrical conductor, for example through the use of P-type dopants or N-type dopants (depending on whether the device is PMOS or NMOS), or an electrical insulator.

In another embodiment, the diamond layer can be conductively doped to provide electrical conduction as well as thermal conduction.

Figure 7:
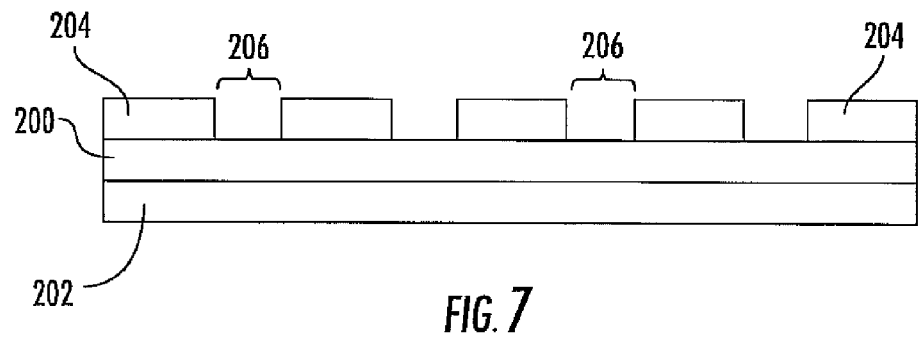
FIGS. 7-13 are cross sections of intermediate structures which can be formed during a process embodiment of the present teachings to form a device in accordance with an embodiment of the present teachings.

A method for forming a semiconductor assembly including a diamond layer through a semiconductor layer such as a semiconductor wafer is depicted in FIGS. 7-13. FIG. 7 depicts a semiconductor layer 200 and a diamond layer 202 covering a side, for example a back side, of the semiconductor layer 200. The diamond layer 202 can be formed separately from the semiconductor layer and attached to the back side of the semiconductor layer using an oxide layer. In other processes, the diamond layer can be grown or deposited on the back side of the semiconductor layer.

After providing the diamond layer and the semiconductor layer, a patterned mask 204, such as a photoresist layer, is formed on a side, for example a front side, of the semiconductor layer 200 to have openings 206 which expose the front side of the semiconductor layer 200.

Figure 8:
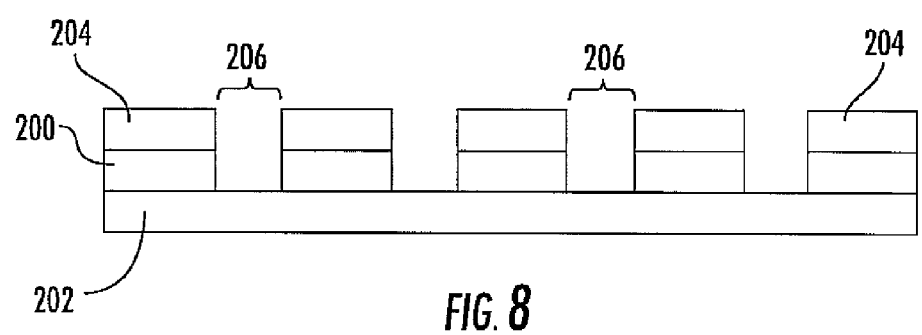

Next, a first portion of the semiconductor layer 200 is removed, for example by etching, to form one or more openings in the semiconductor layer 200 to expose the diamond layer 202 from the front side of the semiconductor layer as depicted in FIG. 8. The one or more openings in the semiconductor layer 200 extends from the front side of the semiconductor layer to the back side.

Figure 9:
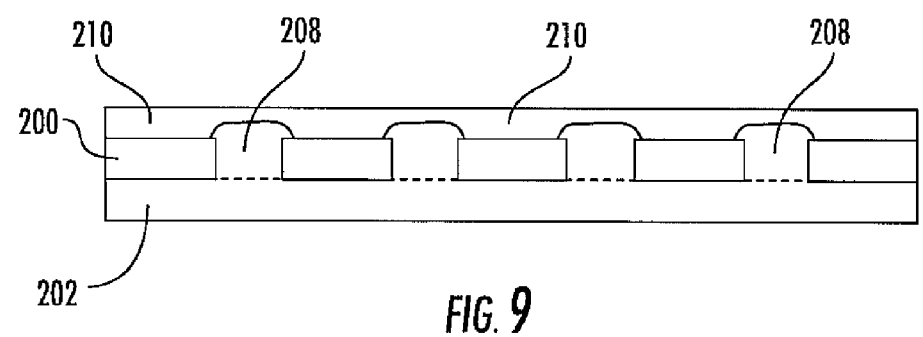

Subsequently, the exposed diamond layer 202 can be used as a crystallization nucleus to grow diamond layer portions 208 through the openings etched in the semiconductor layer. The growth process can be stopped when the grown diamond layer portions 208 are even with the front of the semiconductor layer 200, or the growth process can continue as until the grown diamond layer portions 208 extend through the openings as depicted in FIG. 9. The grown diamond layer 208 extends through the opening.

Figure 10:
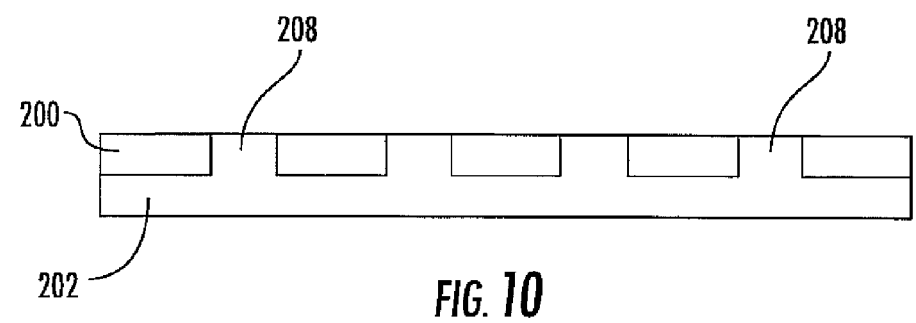

A spun-on or deposited fill layer 210 can be formed over the front of the semiconductor layer 200 and the grown diamond layer 208 as depicted in FIG. 9, then the fill layer and grown diamond layer 208 can be planarized, for example using CMP, to result in the FIG. 10 structure. The fill layer may protect the semiconductor layer during CMP.

Figure 11:
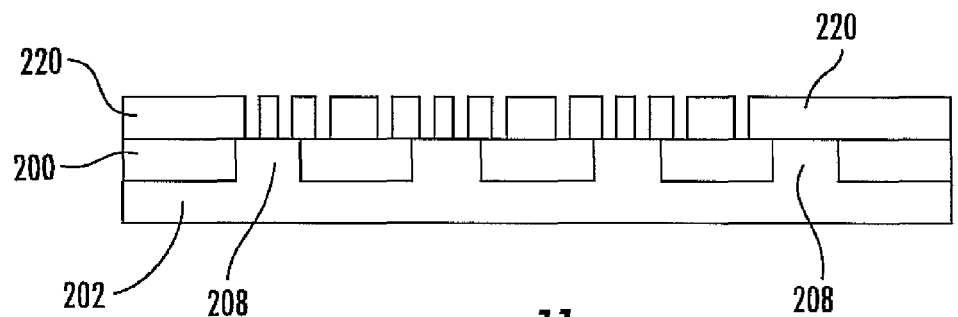
Figure 12:
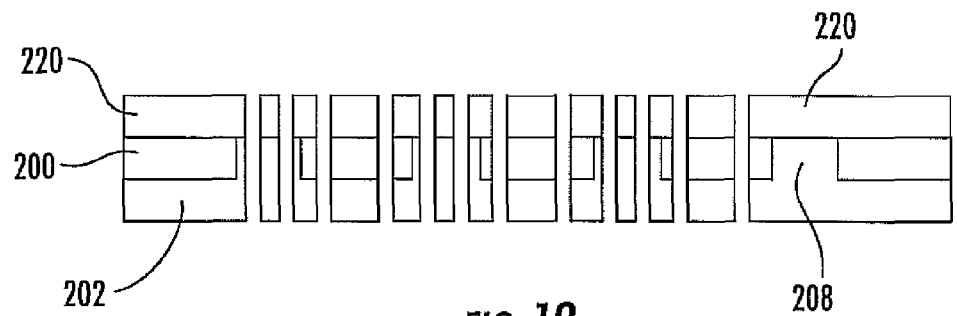

Next, a patterned mask 220 is formed over the semiconductor layer 200 and grown diamond layer 208 as depicted in FIG. 11. The mask has openings therein to define TSVs through the grown diamond layer 208 and the semiconductor layer 200. The structure of FIG. 11 is etched to form first openings through the grown diamond layer 208, second openings through the semiconductor layer 200, and to etch through the diamond layer 202 on the back side of the semiconductor layer to result in the FIG. 12 structure. Subsequently, the mask 220 can be removed to result in the FIG. 13 structure.

Figure 13:
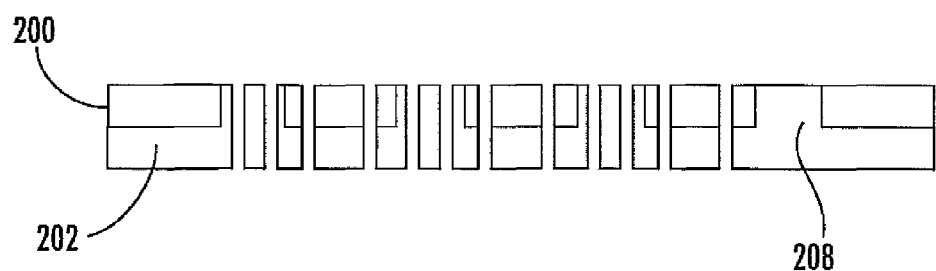

By filling the openings in FIG. 13 with a conductor such as a metal, TSVs similar to TSVs 36, 130 of prior FIGS. can be formed. The openings can be lined with a dielectric such as oxide to provide TSVs which are electrically insulated from the semiconductor layer 200, back side diamond layer 202, and grown diamond layer 208. In an alternate embodiment, the TSVs can be formed through grown diamond layer 208 using a first mask, and the TSVs can be formed at a different time through semiconductor layer 200 using a second mask.

It will be appreciated that the FIGS. may omit various elements such as electrical interconnect layers and semiconductor device diffusions, conductors, and dielectrics to more clearly illustrate features of the heat conduction pad and thermal management. Further, FIGS. 2-6 depict a C4 method of chip-to-chip connection. Other examples of chip-to-chip connections, for example using an interposer, etc., can be used if sufficient thermal conductivity can be maintained in the connection for the heat conduction pads.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A method for forming a semiconductor assembly, comprising:
   removing a first portion of a semiconductor layer to form a first opening therethrough which extends from a front side of the semiconductor layer to a back side of the semiconductor layer;
   forming a diamond layer that extends through the first opening and comprises a first surface at the front side of the semiconductor layer and a second surface at the back side of the semiconductor layer;
   removing a second portion of the semiconductor layer to form a second opening therethrough which extends from the front side of the semiconductor layer to the back side of the semiconductor layer; and
   forming a conductive layer that extends through the second opening and comprises a first surface at the front side of the semiconductor layer and a second surface at the back side of the semiconductor layer.

2. The method of claim 1, further comprising:
   etching the semiconductor layer from the front side of the semiconductor layer to expose a diamond layer formed over the back side of the semiconductor layer; and
   growing the diamond layer that extends through the first opening using the diamond layer formed over the back of the semiconductor layer as a crystallization nucleus.

3. The method of claim 2, further comprising:
   planarizing the first surface of the diamond layer at the front side of the semiconductor layer to form a planarized diamond surface that is co-planar with the front side of the semiconductor layer.

4. The method of claim 3 wherein the semiconductor layer is a first semiconductor layer, the planarized diamond surface is a first planarized diamond surface, and the method further comprises:

connecting the first planarized diamond surface with a second planarized diamond surface formed through an opening of a second semiconductor layer with a thermally conductive connection wherein, during operation of the semiconductor assembly, the thermally conductive connection is adapted to conduct heat away from the first and second semiconductor layers.

5. The method of claim 1, further comprising:

etching at least one opening through the diamond layer;

forming an electrically conductive via within the at least one opening through the diamond layer wherein, during operation of the semiconductor assembly, the diamond layer electrically isolates the electrically conductive via from the semiconductor layer.

6. The method of claim 5, further comprising:

the formation of the electrically conductive via within the at least one opening directly interposes the electrically conductive via between first and second portions of the semiconductor layer.

7. A method for forming a semiconductor assembly, comprising:

removing a thickness of a semiconductor layer to form an opening in the semiconductor layer and to expose a first diamond layer on a back side of the semiconductor layer;

growing a second diamond layer through the opening in the semiconductor layer using the first diamond layer as a crystallization nucleus;

etching at least one opening through both the first diamond layer and the second diamond layer to provide at least one via opening that extends from a back surface of the first diamond layer to a front surface of the second diamond layer and which extends through the semiconductor layer; and filling the at least one via opening with a conductive layer to provide at least one via that extends from the back surface of the first diamond layer to the front surface of the second diamond layer and that extends through the semiconductor layer.

8. A method for forming a semiconductor device, comprising:

removing a portion of a semiconductor layer to form an opening therethrough which extends from a front side of the semiconductor layer to a back side of the semiconductor layer; and forming a diamond layer which extends through the opening and comprises a first exposed surface at the front side of the semiconductor layer and a second exposed surface at the back side of the semiconductor layer.

9. The method of claim 8, further comprising:

etching the semiconductor layer to expose a diamond layer formed over the back side of the semiconductor layer; and growing the diamond layer which extends through the opening using the diamond layer formed over the back of the semiconductor layer as a crystallization nucleus.

10. The method of claim 9, further comprising:

planarizing the first exposed surface at the front side of the semiconductor layer to form a planarized diamond surface which is co-planar with the front side of the semiconductor layer.

11. The method of claim 10, wherein the semiconductor layer is a first semiconductor layer, the planarized diamond surface is a first planarized diamond surface, and the method further comprises:

connecting the first planarized diamond surface with a second planarized surface formed through an opening of a second semiconductor layer with a thermally conductive connection wherein, during operation of the semiconductor device, the thermally conductive connection is adapted to conduct heat away from the first and second semiconductor layers.

* * * * *